(12) United States Patent
Mu et al.

(10) Patent No.: US 11,418,003 B2
(45) Date of Patent: Aug. 16, 2022

(54) CHIP ON CARRIER

(71) Applicant: FINISAR CORPORATION, Sunnyvale, CA (US)

(72) Inventors: Jianwei Mu, Pleasanton, CA (US); Frank Lei Ding, Milpitas, CA (US); Tao Wu, Union City, CA (US); Hongyu Deng, Saratoga, CA (US); Maziar Amirkiai, Sunnyvale, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 43 days.

(21) Appl. No.: 16/533,714

(22) Filed: Aug. 6, 2019

(65) Prior Publication Data
US 2019/0379176 A1    Dec. 12, 2019

Related U.S. Application Data

(63) Continuation of application No. 16/003,074, filed on Jun. 7, 2018, now Pat. No. 10,374,386.

(51) Int. Cl.
*H01S 5/02325* (2021.01)
*H01L 23/498* (2006.01)
(Continued)

(52) U.S. Cl.
CPC ...... *H01S 5/02325* (2021.01); *H01L 21/4857* (2013.01); *H01L 23/345* (2013.01);
(Continued)

(58) Field of Classification Search
CPC ............ H01S 5/02453; H01S 5/02325; H01S 5/0235–0239; H01L 23/49838; H01L 23/49822–49833
See application file for complete search history.

(56) References Cited

U.S. PATENT DOCUMENTS 5,606,358 A * 2/1997 Beaman ............. B41J 2/45
257/E27.121
6,456,641 B1 * 9/2002 Hauer ............. H01S 5/022
372/50.1
(Continued)

FOREIGN PATENT DOCUMENTS

CN        1647334 A  * 7/2005  ......... H01S 5/02212
CN     105703214 A  * 6/2016
(Continued)

*Primary Examiner* — Joshua King
(74) *Attorney, Agent, or Firm* — Blank Rome LLP

(57) ABSTRACT

A chip may include a first substantially planar isolation layer with a first surface and a second surface opposite the first surface. The chip may include a first substantially planar conduction layer with a first surface positioned adjacent to the second surface of the first isolation layer and a second surface opposite the first surface. The chip may include a second substantially planar isolation layer with a first surface positioned adjacent to the second surface of the first conduction layer and a second surface opposite the first surface. The chip may include a second conduction layer etched on the second surface of the second isolation layer. The second conduction layer may include an anode trace, a cathode trace, and an optical transmitter positioned on the cathode trace. The chip may include one or more vias through the second isolation layer electrically coupling the anode trace with the first conduction layer.

22 Claims, 4 Drawing Sheets

(51) Int. Cl.
  *H01S 5/024* (2006.01)
  *H01L 23/34* (2006.01)
  *H01L 21/48* (2006.01)
  *H01S 5/0233* (2021.01)
  *H01S 5/0235* (2021.01)

(52) U.S. Cl.
  CPC .. *H01L 23/49822* (2013.01); *H01L 23/49838* (2013.01); *H01S 5/024* (2013.01); *H01S 5/0233* (2021.01); *H01S 5/0235* (2021.01); *H01S 5/02453* (2013.01)

(56) References Cited

U.S. PATENT DOCUMENTS

| | | | | |
|---|---|---|---|---|
| 6,586,678 B1* | 7/2003 | Rosenberg | H01S 5/02212 | 174/520 |
| 6,933,450 B2* | 8/2005 | Okumichi | H01L 23/49827 | 174/255 |
| 6,996,304 B2* | 2/2006 | Aronson | H01S 5/02212 | 257/E23.19 |
| 7,039,083 B2* | 5/2006 | Carroll | H01S 5/042 | 372/36 |
| 7,412,120 B2* | 8/2008 | Yamamoto | H01S 5/02345 | 385/14 |
| 7,439,449 B1* | 10/2008 | Kumar | G02B 6/4292 | 174/254 |
| 7,629,537 B2* | 12/2009 | Ice | H05K 1/028 | 174/254 |
| 8,058,956 B2* | 11/2011 | Jow | H05K 1/0222 | 333/260 |
| 9,264,010 B2* | 2/2016 | Lee | H03H 7/17 | |
| 9,591,759 B2* | 3/2017 | Wang | H05K 1/162 | |
| 9,651,751 B1* | 5/2017 | Ding | H01S 5/02345 | |
| 9,900,991 B2* | 2/2018 | Kang | H05K 1/025 | |
| 10,295,768 B2* | 5/2019 | Lau | G02B 6/4274 | |
| 10,374,386 B1* | 8/2019 | Mu | H01L 21/4857 | |
| 2003/0052380 A1* | 3/2003 | Yeo | H01S 5/0427 | 257/432 |
| 2004/0037519 A1* | 2/2004 | Kilian | G02B 6/4202 | 385/94 |
| 2004/0053014 A1* | 3/2004 | Sato | H05K 1/0222 | 428/195.1 |
| 2004/0074661 A1* | 4/2004 | Schiaffino | H01S 5/02212 | 174/539 |
| 2004/0129441 A1* | 7/2004 | Giaretta | H01S 5/02212 | 174/548 |
| 2004/0163836 A1* | 8/2004 | Kumar | H01S 5/02212 | 174/50 |
| 2004/0190580 A1* | 9/2004 | Pezeshki | H01S 5/0261 | 372/96 |
| 2005/0025202 A1* | 2/2005 | Kagaya | H01S 5/0427 | 372/38.02 |
| 2005/0082550 A1* | 4/2005 | Hamaoka | H01L 24/49 | 257/80 |
| 2005/0098348 A1* | 5/2005 | Okumichi | H01L 23/552 | 174/262 |
| 2005/0232321 A1* | 10/2005 | Inoue | H01S 5/02212 | 372/43.01 |
| 2008/0035935 A1* | 2/2008 | Shum | H01L 33/62 | 257/79 |
| 2008/0234560 A1* | 9/2008 | Nomoto | A61B 5/14552 | 600/310 |
| 2009/0201958 A1* | 8/2009 | Albrecht | H01S 5/041 | 372/36 |
| 2009/0267100 A1* | 10/2009 | Miyake | H01L 29/2003 | 257/98 |
| 2010/0220755 A1* | 9/2010 | Frank | B82Y 20/00 | 372/36 |
| 2011/0165707 A1* | 7/2011 | Lott | H01L 31/028 | 438/27 |
| 2011/0186874 A1* | 8/2011 | Shum | H01L 25/0753 | 257/88 |
| 2012/0106584 A1* | 5/2012 | Katsuki | H01S 5/4031 | 372/50.12 |
| 2012/0128290 A1* | 5/2012 | Han | G02B 6/4206 | 385/14 |
| 2012/0153340 A1* | 6/2012 | Song | H01L 33/54 | 257/99 |
| 2012/0328229 A1* | 12/2012 | Kogo | G02B 6/4201 | 385/8 |
| 2013/0163626 A1* | 6/2013 | Seurin | F21V 29/74 | 372/35 |
| 2013/0223789 A1* | 8/2013 | Lee | H01S 5/02326 | 385/14 |
| 2013/0235542 A1* | 9/2013 | Song | H05K 1/0243 | 361/773 |
| 2013/0258597 A1* | 10/2013 | Kim | H01S 5/02469 | 361/704 |
| 2013/0322068 A1* | 12/2013 | Clark | H01S 5/0231 | 362/235 |
| 2014/0077246 A1* | 3/2014 | Bhat | H01L 33/60 | 257/98 |
| 2014/0086539 A1* | 3/2014 | Goutain | F21K 9/64 | 385/89 |
| 2014/0112363 A1* | 4/2014 | Feitisch | H01S 5/02365 | 372/43.01 |
| 2015/0023376 A1* | 1/2015 | Yamanaka | H01S 5/02469 | 372/36 |
| 2015/0125162 A1* | 5/2015 | Pfnuer | H01L 33/52 | 398/201 |
| 2015/0236472 A1* | 8/2015 | Ide | G02B 6/0005 | 362/553 |
| 2015/0262985 A1* | 9/2015 | Takai | H01L 31/167 | 257/82 |
| 2015/0288049 A1* | 10/2015 | Song | H05K 3/4685 | 361/760 |
| 2016/0050751 A1* | 2/2016 | Amirkiai | H05K 3/4682 | 361/752 |
| 2016/0050775 A1* | 2/2016 | Amirkiai | G02B 6/4263 | 361/752 |
| 2016/0141839 A1* | 5/2016 | Matsubara | H01S 5/4018 | 372/38.05 |
| 2016/0285232 A1* | 9/2016 | Reinert | H01S 5/028 | |
| 2016/0365700 A1* | 12/2016 | Noguchi | H01S 5/02212 | |
| 2017/0194763 A1* | 7/2017 | Treese | H01S 5/02476 | |
| 2017/0310078 A1* | 10/2017 | Hirayama | H01S 5/0235 | |
| 2018/0233880 A1* | 8/2018 | Nadeau | H01S 5/0233 | |
| 2018/0278020 A1* | 9/2018 | Nakajima | H01S 5/06837 | |
| 2018/0301873 A1* | 10/2018 | Singer | H01S 5/227 | |
| 2018/0375285 A1* | 12/2018 | Seidel | H01S 5/0235 | |
| 2019/0036308 A1* | 1/2019 | Carson | H01S 5/0014 | |
| 2019/0044302 A1* | 2/2019 | Kanskar | H01S 5/323 | |
| 2019/0069395 A1* | 2/2019 | Noguchi | H01R 12/65 | |
| 2019/0074658 A1* | 3/2019 | Jungwirth | H01S 5/02212 | |
| 2020/0044412 A1* | 2/2020 | Bovington | H01S 5/02326 | |
| 2020/0111929 A1* | 4/2020 | Koyama | H01S 5/0425 | |

FOREIGN PATENT DOCUMENTS

| | | | | |
|---|---|---|---|---|
| DE | 10344085 B3 * | 6/2005 | | H01S 5/02345 |
| DE | 102005004145 A1 * | 9/2005 | | H01S 5/02453 |
| DE | 102017130131 A1 * | 6/2019 | | H01L 33/0095 |
| EP | 0465230 A2 * | 1/1992 | | G02B 6/43 |
| EP | 2866313 A1 * | 4/2015 | | H01S 5/02415 |
| EP | 3579286 A1 * | 12/2019 | | H01L 33/62 |
| EP | 3675295 A1 * | 7/2020 | | H01S 5/02415 |
| JP | 3853648 B2 * | 12/2006 | | H01S 5/0427 |
| WO | WO-0076038 A1 * | 12/2000 | | H01S 5/0222 |
| WO | WO-2017163612 A1 * | 9/2017 | | H01L 25/07 |

* cited by examiner

CHIP ON CARRIER

CROSS-REFERENCE TO RELATED APPLICATIONS

This application is a Continuation of U.S. patent application Ser. No. 16/003,074, filed Jun. 7, 2018, titled CHIP ON CARRIER, which is incorporated herein by reference in its entirety.

FIELD

The embodiments discussed herein are related to a chip on a carrier.

BACKGROUND

Unless otherwise indicated herein, the materials described herein are not prior art to the claims in the present application and are not admitted to be prior art by inclusion in this section.

The present disclosure relates to high-speed fiber optic networks that use light signals to transmit data over a network. Fiber optic networks have various advantages over other types of networks such as copper wire based networks. Many existing copper wire networks operate at near maximum possible data transmission rates and at near maximum possible distances for copper wire technology. Fiber optic networks are able to reliably transmit data at higher rates over further distances than is possible with copper wire networks.

The claimed subject matter is not limited to configurations that solve any disadvantages or that operate only in environments such as those described above. This background is only provided to illustrate examples of where the present disclosure may be utilized.

SUMMARY

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Some embodiments described herein generally relate to chip on carrier systems and devices.

In one example, a chip on a carrier may include a first substantially planar isolation layer with a first surface and a second surface opposite the first surface. The chip may also include a first substantially planar conduction layer with a first surface and a second surface opposite the first surface. The first surface of the first conduction layer may be positioned adjacent to the second surface of the first isolation layer. The chip may further include a second substantially planar isolation layer with a first surface and a second surface opposite the first surface. The first surface of the second isolation layer may be positioned adjacent to the second surface of the first conduction layer. The chip may also include a second conduction layer etched on the second surface of the second isolation layer. The second conduction layer may include an anode trace, a cathode trace, and an optical transmitter positioned on the cathode trace. The chip may further include one or more vias through the second isolation layer electrically coupling the anode trace with the first conduction layer.

In another example, a chip on a carrier may include a first substantially planar isolation layer with a first surface and a second surface opposite the first surface. The chip may also include a first substantially planar conduction layer with a first surface and a second surface opposite the first surface. The first surface of the first conduction layer may be positioned adjacent to the second surface of the first isolation layer. The chip may further include a second substantially planar isolation layer with a first surface and a second surface opposite the first surface. The first surface of the second isolation layer may be positioned adjacent to the second surface of the first conduction layer. The chip may also include a second conduction layer etched on the second surface of the second isolation layer. The second conduction layer may include an anode trace, a cathode trace, and an optical transmitter positioned on the cathode trace. The chip may further include a heating resistor positioned on the second surface of the second isolation layer. The chip may also include one or more vias through the second isolation layer electrically coupling the anode trace with the first conduction layer.

In yet another example, a method to manufacture a chip on a carrier, the chip on carrier including a first substantially planar isolation layer with a first surface and a second surface opposite the first surface, may include positioning a first surface of a first substantially planar conduction layer adjacent to the second surface of the first isolation layer. The method may also include positioning a first surface of a second substantially planar isolation layer adjacent to a second surface of the first conduction layer. The second surface of the first conduction layer may be opposite the first surface of the first conduction layer. The method may further include etching a second conduction layer on a second surface of the second isolation layer. The second surface of the second isolation layer may be opposite the first surface of the second isolation layer. The second conduction layer may include an anode trace and a cathode trace. The method may also include creating one or more vias through the second isolation layer to electrically couple the anode trace with the first conduction layer.

This Summary is provided to introduce a selection of concepts in a simplified form that are further described below in the Detailed Description. This Summary is not intended to identify key features or essential characteristics of the disclosed subject matter, nor is it intended to be used as an aid in determining the scope of the claims. Additional features and advantages will be set forth in the description which follows, and in part will be obvious from the description, or may be learned by practice.

BRIEF DESCRIPTION OF DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF SOME EXAMPLE EMBODIMENTS

Figure 1:
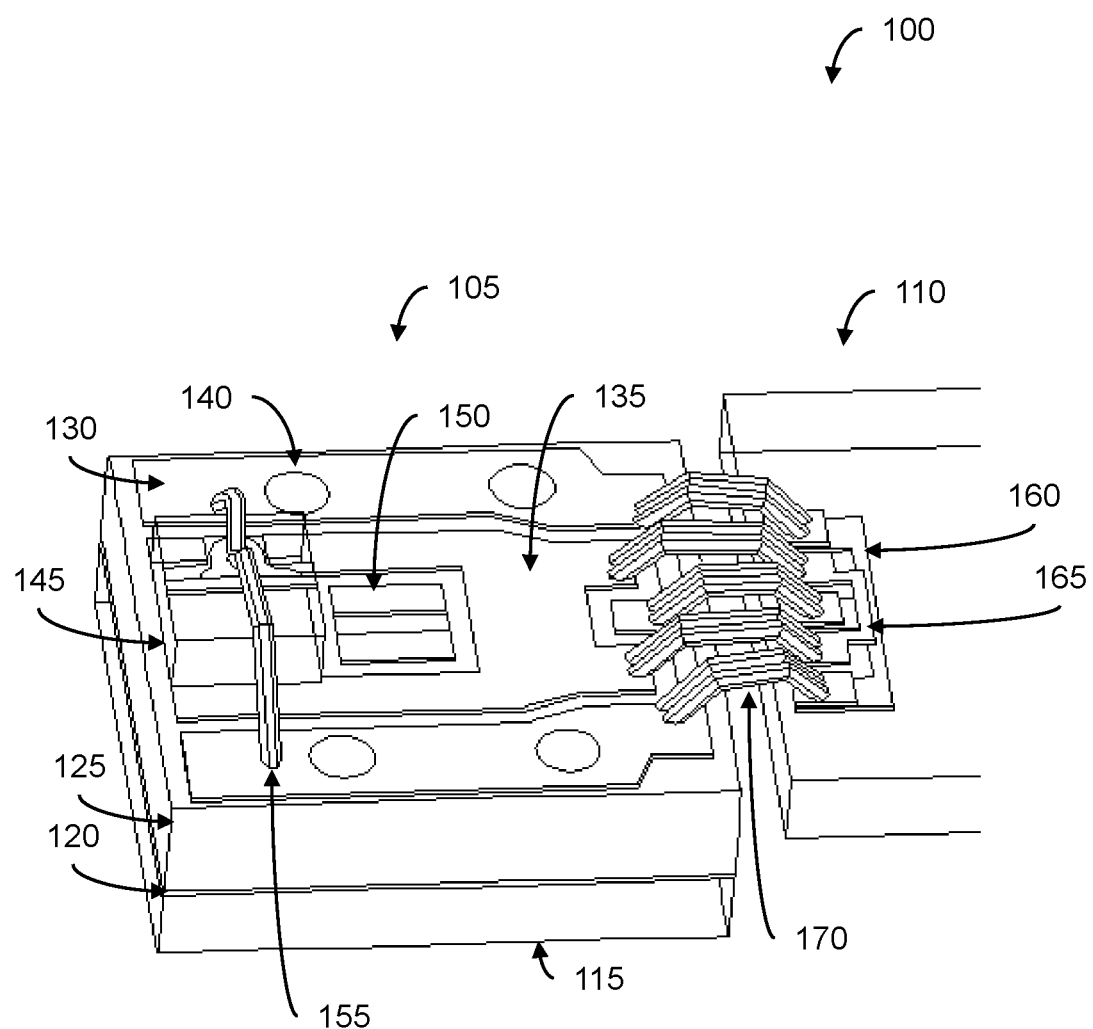
FIG. 1 is a perspective view of an example chip on a carrier.

High-speed fiber optic networks use light signals (which may also be referred to as optical signals) to transmit data over a network. Fiber optic networks have various advantages over other types of networks such as copper wire based networks. Many existing copper wire networks operate at near maximum possible data transmission rates and at near maximum possible distances for copper wire technology. Fiber optic networks are able to reliably transmit data at higher rates over further distances than is possible with copper wire networks.

Although fiber optic networks use light signals to carry data, many electronic devices such as computers and other network devices use electrical signals. Accordingly, optoelectronic assemblies may be used to convert electrical signals to optical signals, convert optical signals to electrical signals, or convert both electrical signals to optical signals and optical signals to electrical signals.

Chips on carriers may include optoelectronic devices such as receivers and transmitters. A receiver receives light signals with a light detector such as a photodiode and converts light signals into electrical signals. A transmitter receives electrical signals and transmits corresponding light signals. A transmitter may include an optical transmitter such as a laser that generates light that is transmitted to a fiber optic network. Chips on carriers may include various components such as optical components and/or electronic components.

Some optoelectronic devices may include multiple channels ("multi-channel optoelectronic devices"), with each channel corresponding to a set of one or more optical signals travelling through an optical fiber. Multi-channel optoelectronic devices may support increased data transfer rates through fiber optic networks. For example, a four channel optoelectronic device may be able to send and receive data at data transfer rates of approximately four times the data transfer rate of a comparable single channel optoelectronic device.

In some optoelectronic devices, electronic and/or radio frequency signal transmission lines ("RF lines") may couple lasers or other components of optoelectronic devices. The electrical performance of the RF lines ("RF performance" or "RF response") may be important to the operation of optoelectronic devices. Accurately controlling and/or reducing the dimensions of RF lines may contribute to optoelectronic devices with suitable and/or favorable RF performance. However, the design and positioning of components of optoelectronic devices may prevent the length of RF lines from being sufficiently controlled and/or minimized. The electrical performance of the RF lines may be particularly important for relatively high frequency optoelectronic devices, such as those that operate at 1, 2, 4, 10, 30, 50 gigabits per second (Gb/s) or higher.

Components such as chips on carriers or portions of chips on carriers may be produced in large quantities and the produced components may need to comply with target specifications that specify various aspects of the produced components (e.g., shape, dimensions, and/or positioning). The produced components may have actual specifications that differ from the target specifications. Some variation in specifications may be permitted because the produced components may nevertheless be suitable or work properly, e.g., if the variation is sufficiently small. Other variations in specifications may result in components that are unsuitable for operation or use, e.g., if the variation is too large. Tolerance may refer to an allowable amount of variation of a specification (e.g., dimension or positioning) from a target. Some specifications may have higher ("wider") or lower ("tighter") tolerance. For example, outside dimensions of chips on carriers may have a wider tolerance because the variations may not affect the operation of the produced optoelectronic chips on carriers. In another example, the positioning of optical components may require a tighter tolerance because the positioning may affect the focus and/or transmission of optical signals. In yet another example, the dimensions of RF lines may require tighter tolerances because the dimensions may significantly affect RF performance.

The selected production processes may affect the prevalence and extent of the variations. In some circumstances the production processes may be controlled to increase or decrease the range of variation, the frequency of the variations, or other aspects. In some circumstances, producing components to tighter tolerances may increase production costs, or producing components to wider tolerances may decrease production costs. For example, the tighter tolerance production processes may be more expensive than wider tolerance production processes. In addition, the tighter the tolerance, the greater the number of unsuitable components that may result from a given production process. Unsuitable components may be discarded without recovering production costs or unsuitable components may be repaired which may add to production costs. Production processes may be modified to decrease or eliminate the production of unsuitable components, but in some circumstances this may increase costs.

FIG. 1 is a perspective view of an example chip on a carrier system 100, arranged in accordance with at least one embodiment described herein. The example chip on a carrier system 100 may include a chip on a carrier 105 and an electronic device 110. In some embodiments, the chip on a carrier 105 may be electrically coupled with the electronic device 110 with multiple wire bonds 170. The chip on a carrier 105 may include a first isolation layer 115, a first conduction layer 120, a second isolation layer 125, a second conduction layer that includes an anode trace 130 and a cathode trace 135, and one or more vias 140 through the second isolation layer 125. The cathode trace 135 may include an optical transmitter 145 electrically coupled with the anode trace 130 by a wire bond 155. The chip on a carrier 105 may include a heating resistor 150 positioned on the second isolation layer 125. The electronic device 110 may include an anode trace 160 and a cathode trace 165 electrically coupled with the anode trace 130 and the cathode trace 135 of the chip on a carrier 105, respectively.

In some embodiments, the first isolation layer 115 may be rectangular in shape, e.g., when viewed from an overhead view. Alternately, the first isolation layer 115 may be circular, ovular, triangular, or any other shape. In some embodiments, the first isolation layer 115 may include a first surface and a second surface. The first surface and the second surface of the first isolation layer 115 may be substantially planar. Substantially planar may include surfaces that are level, flat, even, or smooth. For example, a surface that is level within a tolerance may be substantially planar. The first surface and the second surface of the first isolation layer 115 may be parallel surfaces. In some embodiments, the first isolation layer 115 may include a thickness between the first surface and the second surface of the first isolation layer 115 of approximately 0.10-0.50 millimeters (mm). Alternately, in some embodiments, the first isolation layer 115 may include a thickness between the first surface and the second surface of the first isolation layer 115 of approximately 0.15-0.30 mm. In some embodiments, the material of the first isolation layer 115 may be selected based on its electrically insulating properties and may include aluminum nitride or other suitable material(s).

In some embodiments, the first conduction layer 120 may be shaped and/or dimensioned to match the second surface of the first isolation layer 115. Alternatively, the first conduction layer 120 may have a different shape and/or may be larger or smaller than the first isolation layer 115. A first surface of the first conduction layer 120 may be positioned adjacent to the second surface of the first isolation layer 115. The first conduction layer 120 may also include a second surface opposite the first surface of the first conduction layer 120. The first surface and the second surface of the first conduction layer 120 may be substantially planar and may be parallel to each other. In some embodiments, a thickness between the first surface and the second surface of the first conduction layer 120 may be less than the thickness between the first surface and the second surface of the first isolation layer 115. For example, the first conduction layer 120 may include a thickness between the first surface and the second surface of the first conduction layer 120 of approximately 5-10 micrometers (µm). In some embodiments, the material of the first conduction layer 120 may be selected based on its electrically conducting properties and may include tungsten or other suitable material(s). In some embodiments, the first conduction layer 120 may be etched on the second surface of the first isolation layer 115.

In some embodiments, the second isolation layer 125 may be shaped and/or dimensioned to match the first conduction layer 120. Alternatively, the second isolation layer 125 may have a different shape and/or may be larger or smaller than the first conduction layer 120. A first surface of the second isolation layer 125 may be positioned adjacent to the second surface of the first conduction layer 120. The second isolation layer may also include a second surface opposite the first surface of the second isolation layer 125. The first surface and the second surface of the second isolation layer 125 may be substantially planar and may be parallel to each other. In some embodiments, the second isolation layer 125 may include a thickness between the first surface and the second surface of the second isolation layer 125 of approximately 0.10-0.30 mm. Alternately, in some embodiments, the second isolation layer 125 may include a thickness between the first surface and the second surface of the second isolation layer 125 of approximately 0.10-0.20 mm. In some embodiments, the material of the second isolation layer 125 may be selected based on its electrically insulating properties and may include aluminum nitride or other suitable material(s).

In some embodiments, the second conduction layer may be etched on the second surface of the second isolation layer 125. The second conduction layer may include the anode trace 130 and the cathode trace 135. The anode trace 130 may include a substantially U-shaped pattern generally along at least a portion of an outer perimeter of the second conduction layer. The cathode trace 135 may include a substantially O-shaped pattern generally positioned inside the anode trace 130. In some embodiments, an optical transmitter 145 may be positioned on the cathode trace 135.

The optical transmitter 145 may be electrically coupled with the anode trace 130 with the wire bond 155. In some embodiments, a thickness of the second conduction layer may be less than the thickness between the first surface and the second surface of the second isolation layer 125. For example, the second conduction layer may include a thickness between the first surface and the second surface of the second conduction layer of approximately 2-5 µm. In some embodiments, the material of the second conduction layer may be selected based on its electrically conducting properties and may include one or more of titanium, palladium, gold, or other suitable material(s).

In some embodiments, the thicknesses of the first isolation layer 115, the first conduction layer 120, the second isolation layer 125, and/or the second conduction layer may be selected such that parasitic capacitance of the chip on a carrier 105 is reduced compared to some other chip on a carrier designs. Parasitic capacitance may impact packaging and may result in transmission resonance, noisy eye, and high jitter. In some embodiments, the first isolation layer 115 may help isolate the chip ground from the packaging ground.

The first isolation layer 115 and the second isolation layer 125 may be formed out of a substrate material such as a ceramic material or other suitable material. Some or all of the first and second isolation layers 115 and 125 may include a material selected for various properties such as high thermal conductivity, electrical insulation, cost, stability, heat tolerance, or other properties. In an embodiment, at least a portion of the first and second isolation layers 115 and 125 may be formed of a ceramic material such as one or more of alumina, aluminum oxide, aluminum nitrate, aluminum nitride, or other suitable materials. Alternately or additionally, at least a portion of the first and second isolation layers 115 and 125 may be formed of one or more of silicon, silicon dioxide, sapphire, germanium, gallium arsenide, an alloy of silicon and germanium, or indium phosphide. In some embodiments, the first and second isolation layers 115 and 125 may be formed of the same material. Alternately or additionally, the first and second isolation layers 115 and 125 may be formed of different materials.

In some configurations, the first conduction layer 120 and the second conduction layer may include a material selected for various properties such as high thermal conductivity, electrical conduction, cost, stability, heat tolerance, or other properties. The first conduction layer 120 and the second conduction layer, including the anode trace 130 and the cathode trace 135, may be formed of any suitable electrically conductive and/or thermally conductive material. In some examples, the first conduction layer 120 and the second conduction layer may be formed of a metal such as one or more of silver (Ag), gold (Au), nickel (Ni), titanium (TI), palladium (Pd), tungsten (W), tungsten-molybdenum (WMo), copper (Cu), or other material. The first conduction layer 120 and the second conduction layer may be formed by any suitable process. For example, the first conduction layer 120 may be etched on the second surface of the first isolation layer 115 and the second conduction layer, including the anode trace 130 and the cathode trace 135, may be etched on the second surface of the second isolation layer 125.

The vias 140 may electrically couple the anode trace 130 with the first conduction layer 120. For example, in some configurations, the vias 140 may be formed through the second isolation layer 125 to electrically couple the anode trace 130 to the first conduction layer 120. In some embodiments, walls of the vias 140 may include a conductive material that electrically couples the first conduction layer 120 with the anode trace 130. For example, a through hole may be formed through the second isolation layer 125 and a conductive material may be positioned in the through hole to form each of the vias 140. Although the vias 140 may be formed of any suitable conductive material, in some examples, the vias 140 may be formed of a metal such as one or more of silver (Ag), gold (Au), nickel (Ni), titanium (TI), palladium (Pd), tungsten (W), tungsten-molybdenum (WMo), copper (Cu), or other material. The vias 140 may be formed by any suitable process.

In some embodiments, the positioning and size of the vias 140 on the anode trace 130 may help reduce the parasitic capacitance of the chip on a carrier 105. For example, the chip on a carrier 105 may include four vias 140. Each via may be substantially circular in cross section. Each via may include a diameter of approximately 0.08 mm to 0.12 mm. In some embodiments, a center of a first via 140 may be positioned approximately 0.01 mm to 0.085 mm from a first side of the second conduction layer and approximately 0.2 mm to 0.3 mm from a second side of the second conduction layer. The first side and the second side may form a right angle. In these and other embodiments, a center of a second via 140 may be positioned approximately 0.085 mm 0.01 mm 0.01 mm to 0.085 mm from the first side and approximately 0.4 mm to 0.54 mm from the second side. In these and other embodiments, a center of a third via 140 may be positioned approximately 0.6 mm to 0.63 mm from the first side and approximately 0.4 mm to 0.54 mm from the second side. In these and other embodiments, a center of a fourth via 140 may be positioned approximately 0.6 mm 0.63 mm 0.6 mm to 0.63 mm from the first side and approximately 0.2 mm to 0.3 mm from the second side. Although depicted with four vias 140, the chip on a carrier 105 may include any number of vias 140. Additionally or alternately, the vias 140 may be positioned in different locations, may include different shapes, and may include different sizes. For example, the first via 140 may include a square cross section, the second via 140 may include a circular cross section, the third via 140 may include a circular cross section with a larger diameter than the second via 140, and the fourth via 140 may include a triangular cross section.

The optical transmitter 145 may include one or more optical transmitters, optical transmitter arrays, lasers, laser arrays, and/or other suitable components. In some configurations, the optical transmitter 145 may include a laser array. The optical transmitter 145 may be configured to emit multiple channels of optical signals. The optical transmitter 145 may be configured to receive electrical signals from electrical components and to emit corresponding optical signals for transmission through a fiber optic network. The electrical signals may be transmitted to the optical transmitter 145 from control circuitry which may be part of the electronic device 110.

The heating resistor 150 may be positioned on the second isolation layer 125 generally inside an area of the second surface of the second isolation layer 125 that is bounded by the cathode trace 135. For example, the cathode trace 135 may surround the heating resistor 150 on the second isolation layer 125. The heating resistor 150 may be used to manage temperatures. For example, the heating resistor 150 may heat all or portions of the chip on a carrier 105. In some embodiments, the heating resistor 150 may include a material that resists conduction of electricity such that the material heats when current flows through the heating resistor 150. For example, the heating resistor 150 may include a nickel-chromium alloy, an iron-chromium-aluminum alloy, a copper-nickel alloy, ceramics, polymers, composites, and/or other materials. The heating resistor 150 may be used to help maintain a constant operating temperature or a desired operating temperature of the chip on a carrier 105 or of the optical transmitter 145. Additionally or alternately, the heating resistor 150 may increase the range of operating temperatures of the chip on a carrier 105.

In chips on a carrier that include optical transmitters such as lasers, the heating resistor 150 may be used to maintain constant temperatures to stabilize the wavelengths of signals emitted by the lasers. Additionally or alternately, the heating resistor 150 may increase the range of operating temperatures of lasers used in optoelectronic assemblies. For example, common temperatures for operation of a laser on a chip on a carrier may include 10 degrees Celsius (° C.) to 70° C. In some embodiments, inclusion of the heating resistor 150 in the chip on a carrier 105 may increase the range of temperatures for the chip on a carrier 105 to −40° C. to 70° C. compared to some other chips on a carrier. In some embodiments, the range of temperatures may be greater.

In some configurations, the optical transmitter 145 may include a tunable laser. In such configurations, the heating resistor 150 may facilitate temperature control of the tunable laser and/or components coupled to the tunable laser. Controlling the temperature of the tunable laser and/or coupled components may facilitate control of frequencies/wavelengths of optical signals emitted by the tunable laser. For example, the heating resistor 150 may be used to maintain the temperature of the optical transmitter 145 around a specified temperature or range of temperatures so that the optical transmitter 145 emits optical signals around a specified frequency/wavelength or range of frequencies/wavelengths. The tolerance of the temperature range and/or frequency range may depend on the application of the chip on a carrier 105 and/or the optical transmitter 145. In some configurations, the optical transmitter 145 may be configured to emit optical signals of multiple wavelengths. In some configurations, the optical transmitter 145 may be a multi-channel and/or a multi-wavelength tunable laser.

The electronic device 110 may include at least one laser driver. The electronic device 110 may include any suitable amount of laser drivers. The electronic device 110 may be configured to receive electrical signals, modulate the electrical signals, and transmit a modulated signal to the optical transmitter 145, which may be a laser or a laser array. In some configurations, the electronic device 110 may modulate more than one channel of signals. At least one of the electronic device 110 may include an integrated circuit. The electronic device 110 may include one or more of integrated circuits, capacitors, inductors, resistors, control circuitry, diodes, ferrite beads, attenuators, flex cables, and modulation circuitry. In some configurations, the electronic device 110 may be a controller that manages aspects of the chip on a carrier 105. For example, the controller may send and receive control signals to other electrical components or the optical transmitter 145. In some embodiments, the electronic device 110 may provide power to operate the optical transmitter 145 of the chip on a carrier 105.

Aspects of the chip on a carrier system 100 may contribute to decreased production costs. For example, some aspects of the chip on a carrier system 100 may simplify the production processes and/or may decrease the costs of the materials used to produce the chip on a carrier system 100. Some aspects of the chip on a carrier system 100 may facilitate cost-effective production of the chip on a carrier system 100 with desirable RF performance. For example, using the vias 140 instead of wraparounds to electrically couple the anode trace 130 with the first conduction layer 120 may decrease materials costs and may improve the RF performance of the chip on a carrier 105. Additionally or alternately, placing the optical transmitter 145 on the cathode trace 135 on the second isolation layer 125 instead of placing an optical transmitter on a cathode trace positioned on a first isolation layer according to some other designs may decrease costs of producing the chip on a carrier 105 and/or may improve the RF performance of the chip on a carrier 105 compared to the other designs.

Modifications, additions, or omissions may be made to the system 100 without departing from the scope of the present disclosure. For example, in some embodiments, the chip on a carrier 105 may not include the heating resistor 150. Additionally or alternately, the chip on a carrier 105 may include an optical receiver in addition to or in place of the optical transmitter 145. In these and other embodiments, the optical receiver may include one or more optical receivers, optical receiver arrays, monitor photodiodes ("MPD"), MPD arrays, and/or other suitable components. The optical receiver may be configured to receive one or multiple channels of optical signals. The optical receiver may be configured to receive optical signals from a fiber optic network and transmit corresponding electrical signals to electrical components. Electrical signals from the optical receiver may be transmitted to control circuitry which may be part of the electronic device 110. The optical receiver may be configured to receive optical signals travelling from a fiber optic network.

Figure 2:
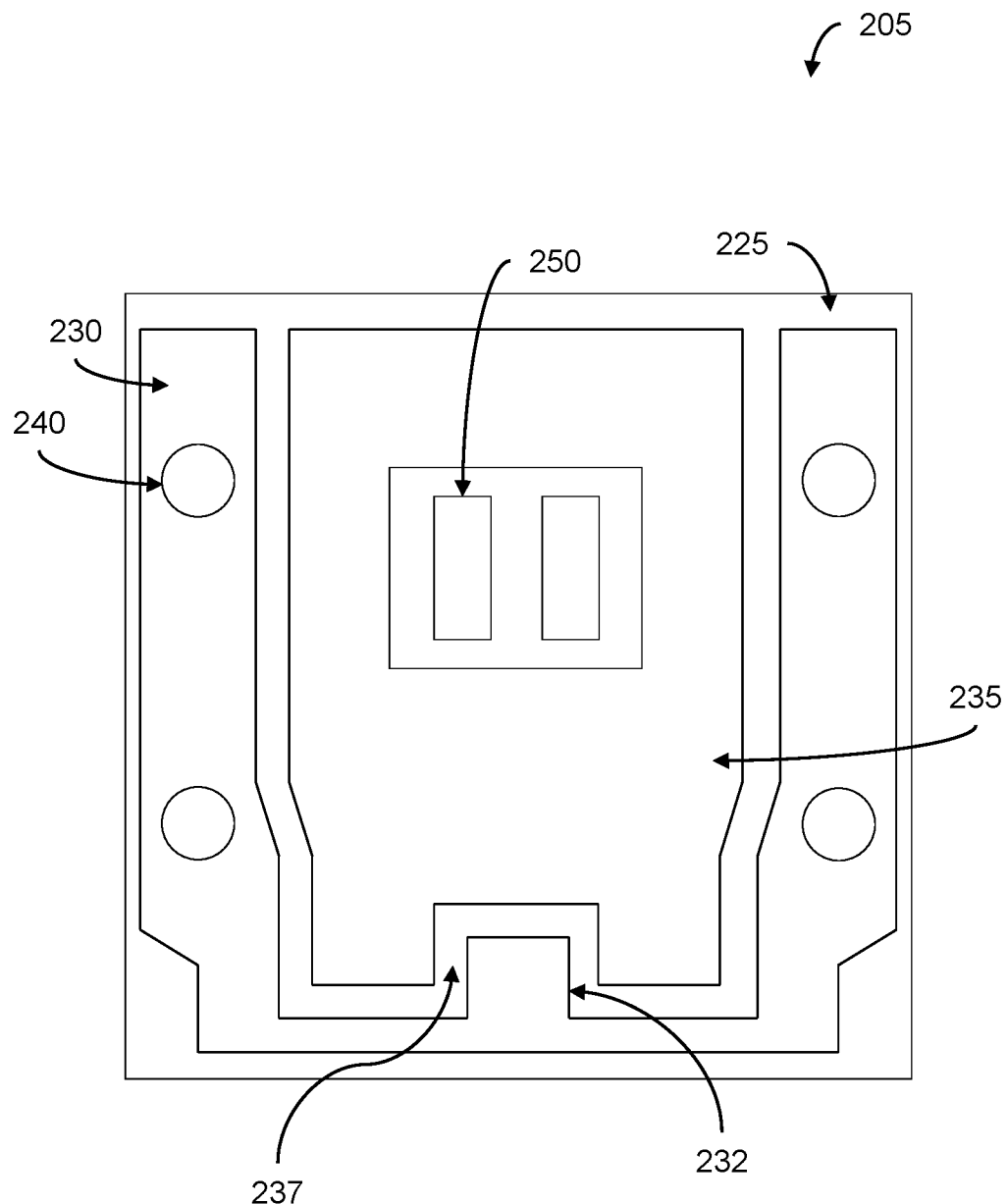
FIG. 2 is a top down view of another example chip on a carrier.

FIG. 2 is a top down view of another example chip on a carrier 205, arranged in accordance with at least one embodiment described herein. The chip on a carrier 205 may be similar to the chip on a carrier 105 of FIG. 1. For example, the chip on a carrier 205 may include a second isolation layer 225, a second conduction layer including an anode trace 230 and a cathode trace 235, and multiple vias 240. In some embodiments, the chip on a carrier 205 may include a heating resistor 250. The second isolation layer 225, the anode trace 230, the cathode trace 235, the vias 240, and the heating resistor 250 may be the same as or similar to the second isolation layer 125, the anode trace 130, the cathode trace 135, the vias 140, and the heating resistor 150 of FIG. 1, respectively.

The anode trace 230 may be substantially U-shaped around an outer edge of the second conduction layer. The cathode trace 235 may be substantially O-shaped inside the anode trace 230. In some embodiments, the anode trace 230 may include a protrusion 232 inward from a first edge of the chip on a carrier 205 towards the center of the chip on a carrier 205. In these and other embodiments, the cathode trace 235 may include a corresponding cavity 237 corresponding to the protrusion 232 on the anode trace 230. In some embodiments, the anode trace 230 and/or the cathode trace 235 may include tapered edges. For example, an outer edge and an inner edge of the anode trace 230 may taper inward towards a closed end of the anode trace 230. Similarly, an outer edge of the cathode trace 235 may taper inward towards a closed end of the anode trace 230. In some embodiments, the tapering of the anode trace 230 and the cathode trace 235 may include different slopes, shapes, and/or patterns. Although depicted with linear tapering, the anode trace 230 and/or the cathode trace 235 may include curved tapering, such as an exponential tapering. Although the tapering of the outer edge and the inner edge of the anode trace 230 are depicted with different shapes, in some embodiments, the tapering may be substantially parallel.

Modifications, additions, or omissions may be made to the chip on a carrier 205 without departing from the scope of the present disclosure. For example, the chip on a carrier 205 may additionally include an optical transmitter, such as the optical transmitter 145 of FIG. 1. Additionally or alternately, the chip on a carrier 205 may not include the heating resistor 250. In some embodiments, the chip on a carrier 205 may include additional vias 240, fewer vias 240, or a different placement of the vias 240. Although depicted as being substantially equivalent in cross section, the vias 240 may include different cross sections and/or different sizes.

Figure 3:
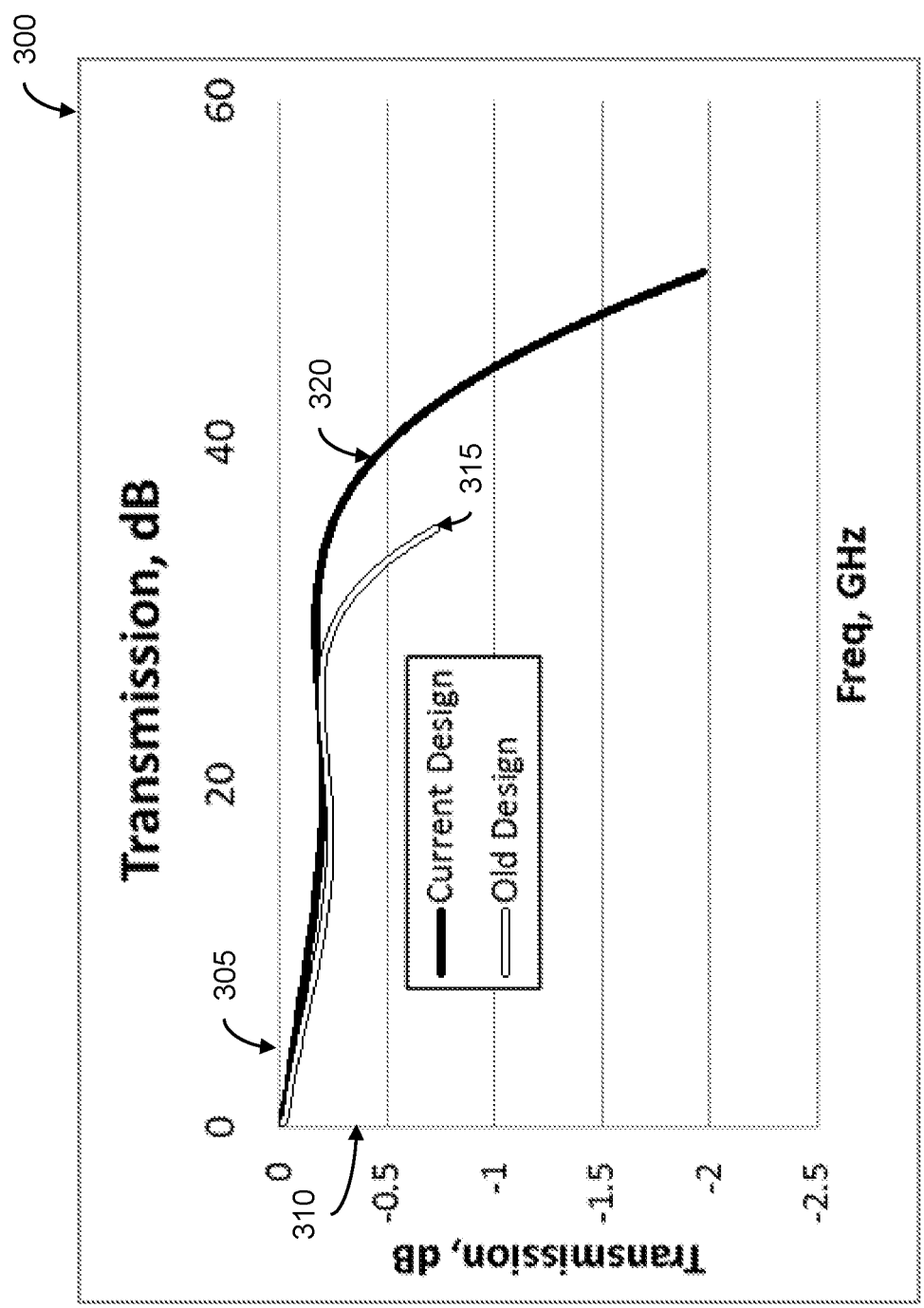
FIG. 3 is a graphical representation of the signal loss of two example chips on carriers.

FIG. 3 is a graphical representation of the signal loss 310 of two example chips on carriers, arranged in accordance with at least one embodiment described herein. The chart 300 depicts the transmission loss 310 in decibels (dB) of transmissions through an example embodiment of an existing chip on a carrier ("Old Design" in FIG. 3) and an example embodiment of a chip on a carrier of the present disclosure ("Current Design" in FIG. 3) as a function of frequency 305 measured in gigahertz (GHz). The curve 320 represents simulated transmission loss of a chip on a carrier similar to the chip on a carrier 105 of FIG. 1 and/or the chip on a carrier 205 of FIG. 2. The curve 315 represents simulated transmission loss of existing chip on a carrier designs, including chips on a carrier that include wraparounds around the sides of the chip on a carrier. As depicted in FIG. 3, existing chip on a carrier designs may begin to experience substantial signal loss at frequencies greater than about 25 GHz while a chip on a carrier in accordance with the present disclosure may not begin to experience substantial signal loss until frequencies greater than about 35 GHz. In some configurations, this may allow the chip on a carrier in accordance with the present disclosure to be used at higher data transmission rates and without signal degradation than some other chip on a carrier designs.

Figure 4:
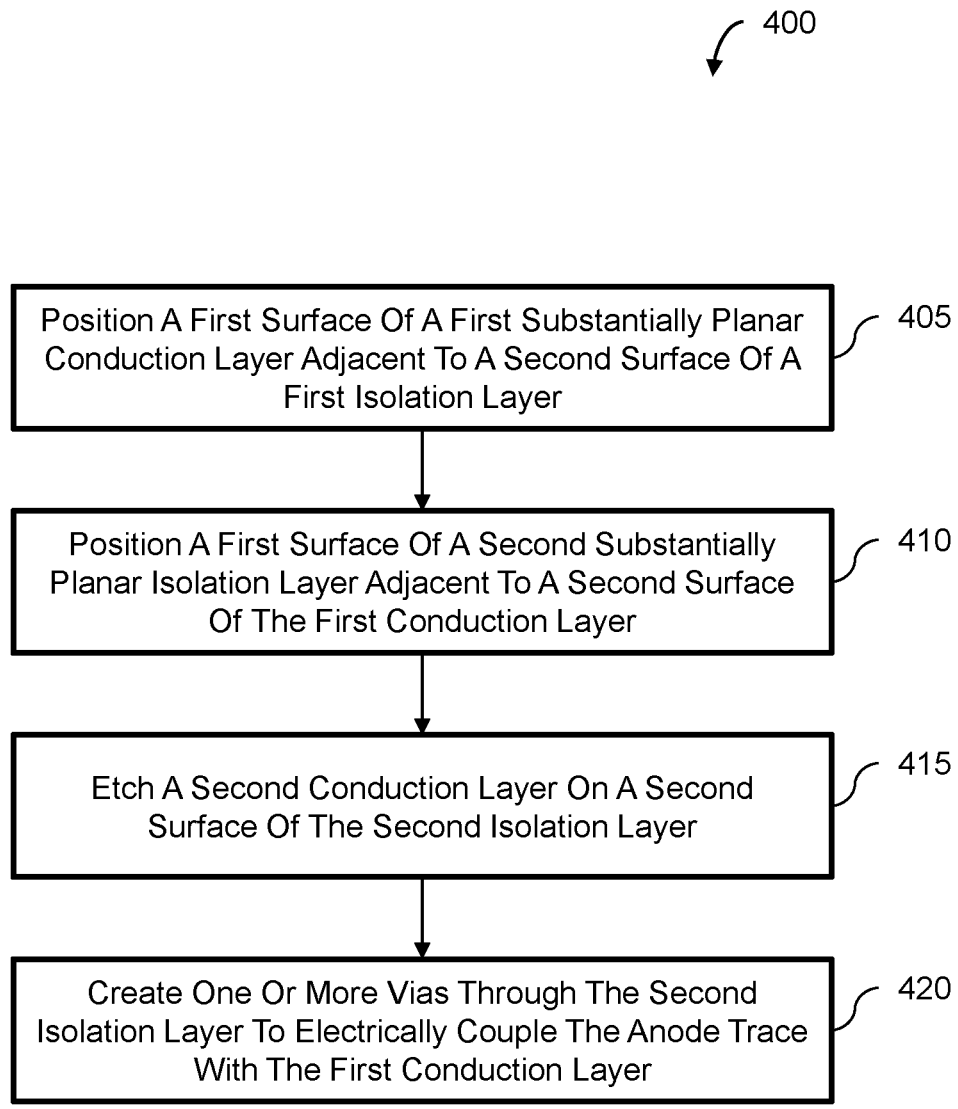
FIG. 4 is a flowchart of an example method to manufacture a chip on a carrier, all arranged in accordance with at least one embodiment described herein.

FIG. 4 is a flowchart of an example method 400 to manufacture a chip on a carrier, arranged in accordance with at least one embodiment described herein. The chip on carrier may include a first substantially planar isolation layer with a first surface and a second surface opposite the first surface. The method 400 may be arranged in accordance with at least one embodiment described in the present disclosure. The method 400 may be performed, in whole or in part, in a manufacturing facility. Although illustrated as discrete blocks, various blocks may be divided into additional blocks, combined into fewer blocks, or eliminated, depending on the desired implementation.

The method 400 may begin at block 405, where a first surface of a first substantially planar conduction layer may be positioned adjacent to the second surface of the first isolation layer. In block 410, a first surface of a second substantially planar isolation layer may be positioned adjacent to a second surface of the first conduction layer. The second surface of the first conduction layer may be opposite the first surface of the first conduction layer.

In block 415, a second conduction layer may be etched on a second surface of the second isolation layer. The second surface of the second isolation layer may be opposite the first surface of the second isolation layer. The second conduction layer may include an anode trace and a cathode trace. In block 420, one or more vias may be created through the second isolation layer to electrically couple the anode trace with the first conduction layer.

One skilled in the art will appreciate that, for this and other processes, operations, and methods disclosed herein, the functions and/or operations performed may be implemented in differing order. Furthermore, the outlined functions and operations are only provided as examples, and some of the functions and operations may be optional, combined into fewer functions and operations, or expanded into additional functions and operations without detracting from the essence of the disclosed embodiments.

For example, in some embodiments, the method 400 may further include positioning an optical transmitter on the cathode trace and/or electrically coupling the optical transmitter to the cathode trace. Alternatively or additionally, in some embodiments, the method 400 may further include positioning a heating resistor on the second surface of the second isolation layer.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method to manufacture a chip on a carrier for first and second electrical connections, the chip on carrier comprising a first substantially planar isolation layer with a first surface and a second surface opposite the first surface, the method comprising:
   positioning a first surface of a first substantially planar conduction layer adjacent to the second surface of the first isolation layer;
   positioning a first surface of a second substantially planar isolation layer adjacent to a second surface of the first conduction layer, the second surface of the first conduction layer opposite the first surface of the first conduction layer;
   etching a second conduction layer on a second surface of the second isolation layer, the second surface of the second isolation layer opposite the first surface of the second isolation layer, by:
      forming an anode trace extending partially around an outer perimeter of the second conduction layer, a portion of the anode trace adjacent to a first end of the chip on carrier being configured to connect to the first electrical connection; and
      forming a cathode trace positioned at least partially inside the anode trace, a portion of the cathode trace adjacent to the first end of the chip on carrier being configured to connect to the second electrical connection;
   creating one or more vias through the second isolation layer to electrically couple the anode trace with the first conduction layer; and
   positioning an optical transmitter on the cathode trace toward a second end of the chip on carrier opposite to the first end.

2. The method of claim 1, further comprising selecting the thicknesses of the first isolation layer, the first conduction layer, the second isolation layer, or the second conduction layer to reduce parasitic capacitance.

3. The method of claim 1, further comprising selecting the position or size of the vias to reduce parasitic capacitance.

4. The method of claim 1, wherein etching the second conduction layer comprises positioning the cathode trace and the anode trace coplanar to one another.

5. The method of claim 1, wherein forming the anode trace extending partially around the outer perimeter of the second conduction layer comprises forming the anode trace as a substantially U-shaped pattern along the outer perimeter of the second conduction layer, and wherein forming the cathode trace positioned at least partially inside the anode trace forming the cathode trace as a substantially O-shaped pattern inside the anode trace.

6. The method of claim 1, further comprising electrically coupling the optical transmitter to the anode trace.

7. The method of claim 6, wherein electrically coupling the optical transmitter to the anode trace comprises electrically coupling a wire bond between the anode trace and the optical transmitter.

8. The method of claim 2, wherein selecting the thickness comprises selecting the thickness of the first isolation layer between the first surface and the second surface of the first isolation layer of approximately 0.10 to 0.50 millimeters (mm).

9. The method of claim 2, wherein selecting the thickness comprises selecting the thickness of the second isolation layer between the first surface and the second surface of the second isolation layer of approximately 0.10 to 0.30 millimeters (mm).

10. The method of claim 2, wherein selecting the thickness comprises:
    selecting the thickness of the first isolation layer between the first surface and the second surface of the first isolation layer of approximately 0.10 to 0.50 millimeters (mm); and
    selecting the thickness of the second isolation layer between the first surface and the second surface of the second isolation layer of approximately 0.10-0.30 mm.

11. The method of claim 10, wherein selecting the thickness of the first isolation layer comprises selecting the thickness of approximately 0.15 to 0.30 mm; and wherein selecting the thickness of the second isolation layer comprises selecting the thickness of approximately 0.10 to 0.20 mm.

12. The method of claim 3, wherein selecting the position or size of the vias comprise selecting a circular cross section of approximately 0.08 millimeters (mm) to 0.12 mm in diameter for at least one of the vias.

13. The method of claim 3, wherein creating the one or more vias comprises creating four vias; and wherein selecting the position or size of the vias comprise:
    positioning a center of a first via of the four vias approximately 0.01 mm to 0.085 mm from a first side of the second conduction layer and approximately 0.2 mm to 0.3 mm from a second side of the second conduction layer, the first side and the second side forming a right angle;
    positioning a center of a second via of the four vias approximately 0.01 mm to 0.085 mm from the first side and approximately 0.4 mm to 0.54 mm from the second side;
    positioning a center of a third via of the four vias approximately 0.6 mm to 0.63 mm from the first side and approximately 0.4 mm to 0.54 mm from the second side; and
    positioning a center of a fourth via of the four vias approximately 0.6 mm to 0.63 mm from the first side and approximately 0.2 mm to 0.3 mm from the second side.

14. The method of claim 1, further comprising positioning a heating resistor on the second surface of the second isolation layer.

15. The method of claim 14, wherein positioning the heating resistor comprises positioning the heating resistor on the second surface of the second isolation layer inside an opening formed in the cathode trace.

16. The method of claim 1, further comprising electrically coupling the first electrical connection with a first wire bond to the portion of the anode adjacent to the first end of the chip on carrier; and electrically coupling the second electrical connection with a second wire bond to the portion of the cathode adjacent to the first end of the chip on carrier.

17. The method of claim 16, wherein forming the anode trace comprises forming the portion of the anode trace with a protrusion configured to connect to the first wire bond; and wherein forming the cathode trace comprises forming the portion of the cathode trace with a corresponding cavity accommodating the protrusion, the portion of the cathode trace on both sides of the cavity being configured to connect to the second wire bond.

18. A method to manufacture a chip on a carrier for first and second electrical connections, the chip on carrier comprising a first substantially planar isolation layer with a first surface and a second surface opposite the first surface, the method comprising:
   positioning a first surface of a first substantially planar conduction layer adjacent to the second surface of the first isolation layer;
   positioning a first surface of a second substantially planar isolation layer adjacent to a second surface of the first conduction layer, the second surface of the first conduction layer opposite the first surface of the first conduction layer;
   etching a second conduction layer on a second surface of the second isolation layer, the second surface of the second isolation layer opposite the first surface of the second isolation layer, by:
      forming a cathode trace having an opening therein exposing the second surface of the second isolation layer; and
      forming an anode trace extending partially around the cathode trace and having an open side toward one end of the chip on carrier; and
   creating one or more vias through the second isolation layer to electrically couple the anode trace with the first conduction layer;
   positioning an optical transmitter on the cathode trace toward the open side of the anode trace; and
   positioning a heating resistor on the second surface of the second isolation layer inside the opening formed in the cathode trace.

19. The method of claim 18, further comprising electrically coupling the optical transmitter with a wire bond to the anode trace.

20. The method of claim 18, wherein forming the anode trace extending partially around the cathode trace comprises forming the anode trace as a substantially U-shaped pattern along an outer perimeter of the second conduction layer, and forming the cathode trace as a substantially O-shaped pattern inside the anode trace.

21. The method of claim 18, further comprising electrically coupling the first electrical connection with a first wire bond to a portion of the anode trace adjacent to an opposite end of the chip on carrier; and electrically coupling the second electrical connection with a second wire bond to a portion of the cathode trace adjacent to the opposite end.

22. The method of claim 21, wherein forming the anode trace comprises forming the portion of the anode trace with a protrusion configured to connect to the first wire bond; and wherein forming the cathode trace comprises forming the portion of the cathode trace with a corresponding cavity accommodating the protrusion, the portion of the cathode trace on both sides of the cavity being configured to connect to the second wire bond.

\* \* \* \* \*